(12) United States Patent
Chung et al.

(10) Patent No.: US 11,424,206 B2
(45) Date of Patent: Aug. 23, 2022

(54) CHIP PACKAGE MODULE INCLUDING FLIP-CHIP GROUND PADS AND POWER PADS, AND WIRE-BONDING GROUND PADS AND POWER PADS

(71) Applicant: REALTEK SEMICONDUCTOR CORP., Hsinchu (TW)

(72) Inventors: Sheng-Feng Chung, Hsinchu County (TW); Cheng-Lun Chu, Kaohsiung (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 180 days.

(21) Appl. No.: 16/876,275

(22) Filed: May 18, 2020

(65) Prior Publication Data

US 2021/0104480 A1     Apr. 8, 2021

(30) Foreign Application Priority Data

Oct. 4, 2019  (TW) ................................. 108136004

(51) Int. Cl.
*H01L 23/00* (2006.01)

(52) U.S. Cl.
CPC .............. *H01L 24/06* (2013.01); *H01L 24/13* (2013.01); *H01L 24/46* (2013.01); *H01L 24/73* (2013.01); *H01L 2224/06515* (2013.01); *H01L 2224/14515* (2013.01)

(58) Field of Classification Search
CPC ......... H01L 24/06; H01L 24/13; H01L 24/46; H01L 24/73
USPC ....................................................... 257/778
See application file for complete search history.

(56) References Cited

U.S. PATENT DOCUMENTS

| | | | | |
|---|---|---|---|---|
| 2003/0201122 A1* | 10/2003 | Hsu | ................... | H01L 23/49838 257/E23.079 |
| 2009/0206461 A1* | 8/2009 | Yoon | ................... | H01L 23/3128 257/737 |
| 2010/0295160 A1 | 11/2010 | Liu et al. | | |
| 2013/0249075 A1* | 9/2013 | Tateiwa | .................. | H01L 24/24 257/734 |

(Continued)

FOREIGN PATENT DOCUMENTS

| | | |
|---|---|---|
| TW | 539238 U | 6/2003 |
| TW | 200725764 A | 7/2007 |
| TW | 201042734 A1 | 12/2010 |

*Primary Examiner* — Matthew E. Gordon
(74) *Attorney, Agent, or Firm* — Li & Cai Intellectual Property (USA) Office

(57) ABSTRACT

A chip package module is provided. The chip package module includes a package substrate, a chip, and a conductive connector assembly. The chip having a first surface and a second surface opposite thereto is disposed on the package substrate. The first surface is divided into a first region, a second region, and a third region, and the second region is located between the first and third regions. The chip includes a flip-chip pad group disposed in the first region, a wire-bonding pad group disposed in the third region, and a signal pad group disposed in the second region. The conductive connector assembly is electrically connected between the chip and the package substrate. One of the flip-chip pad group and the wire-bonding pad group is electrically and physically connected to the conductive connector assembly, and the other one is not physically connected to the conductive connector assembly.

11 Claims, 6 Drawing Sheets

(56) References Cited

U.S. PATENT DOCUMENTS

2018/0068980 A1* 3/2018 Clegg ................ H01L 21/6835

* cited by examiner

CHIP PACKAGE MODULE INCLUDING FLIP-CHIP GROUND PADS AND POWER PADS, AND WIRE-BONDING GROUND PADS AND POWER PADS

CROSS-REFERENCE TO RELATED PATENT APPLICATION

This application claims the benefit of priority to Taiwan Patent Application No. 108136004, filed on Oct. 4, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package module, and more particularly to a chip package module that can be packaged by flip-chip packaging technology or wire-bonding packaging technology according to particular implementations.

BACKGROUND OF THE DISCLOSURE

Recently, flip-chip and wire-bonding packaging technologies have been widely used to package an integrated circuit chip (IC chip) so as to form an electronic component packaged structure.

Despite the cost of the electronic component packaged structure that is fabricated by using the wire-bonding packaging technology being relatively lower, the size of the electronic component packaged structure thus fabricated is relatively larger. Furthermore, it is easier to generate crosstalk and noise in the electronic component packaged structure during signal transmission due to bonding wires being too close together.

Compared to the wire-bonding packaging technology, although the cost of the electronic component packaged structure fabricated by using the flip-chip packaging technology is relatively higher, the electronic component packaged structure has smaller size. Furthermore, better signal transmission quality and lower noise in the electronic component packaged structure fabricated by using the flip-chip packaging technology can be easily achieved since a transmission distance between the IC chip and the circuit board is shorter. Accordingly, the flip-chip packaging technology is usually used for fabricating high-end products, while the wire-bonding packaging technology is usually used for fabricating middle-end products or low-end products.

While IC chips used in high-end, middle-end and low-end products may have the same specification, the arrangements of the pads of the IC chips are different for different packaging technologies, i.e., the flip-chip packaging technology and the wire-bonding packaging technology. To be more specific, in the arrangement of the pads for the flip-chip packaging technology, a plurality of power pads and a plurality of ground pads are usually arranged in a central region of the IC chip. In comparison to the aforementioned arrangement, in another arrangement of the pads for the wire-bonding packaging technology, a plurality of power pads and a plurality of ground pads are usually arranged in a peripheral region of the IC chip.

That is to say, the arrangement of the pads of the IC chip for the flip-chip packaging technology is incompatible with another arrangement of the pads of the IC chip for the wire-bonding packaging technology, and vice versa. As such, in practical application, the flexibility of the IC chip would be limited.

SUMMARY OF THE DISCLOSURE

In response to the above-referenced technical inadequacies, the present disclosure provides a chip package module, and the chip package module includes a chip that can be packaged by using any of a flip-chip packaging technology and a wire-bonding packaging technology according to a practical implementation.

In one aspect, the present disclosure provides a chip package module that includes a package substrate, a chip, and a conductive connector assembly. The chip having a first surface and a second surface opposite to the first surface is disposed on the package substrate. The first surface is divided into a first region, a second region, and a third region, in which the second region is located between the first region and the third region. The chip includes a flip-chip pad group disposed in the first region, a wire-bonding pad group disposed in the third region, and a signal pad group disposed in the second region. The conductive connector assembly is electrically connected between the chip and the package substrate. One of the flip-chip pad group and the wire-bonding pad group is electrically and physically connected to the conductive connector assembly, and the other one of the flip-chip pad group and the wire-bonding pad group is not physically connected to the conductive connector assembly.

Therefore, one of the advantages of the present disclosure is that in the chip package module provided herein, by the technical features of "the chip including the flip-chip pad group, the wire-bonding pad group, and the signal pad group" and "one of the flip-chip pad group and the wire-bonding pad group is electrically and physically connected to the conductive connector assembly, and the other one is not physically connected to the conductive connector assembly," the chip package module can be fabricated by using any one of the flip-chip and wire-bonding packaging technologies according to a field of application thereof, thereby improving application flexibility of the chip. These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
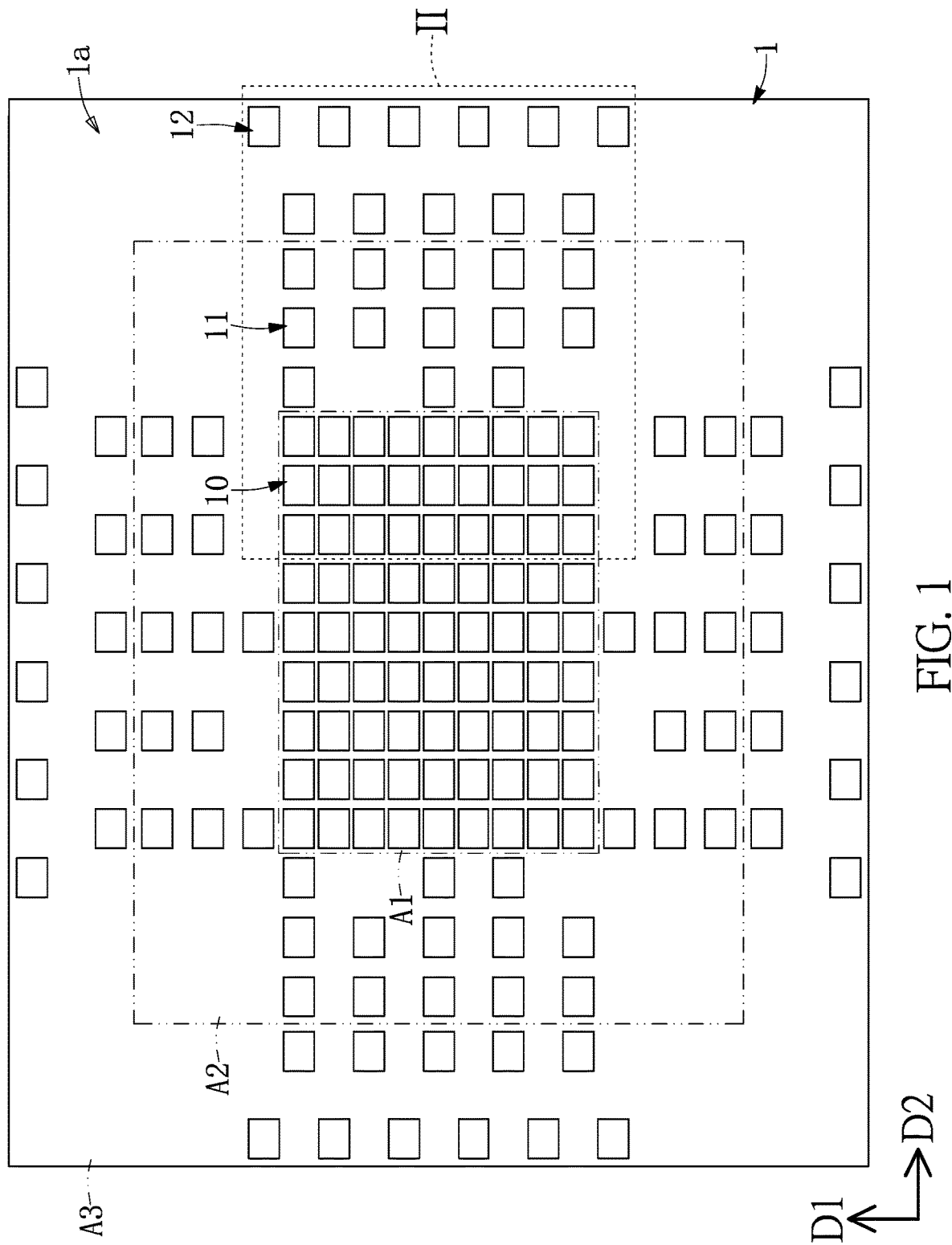
FIG. 1 is a schematic top view of a chip according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
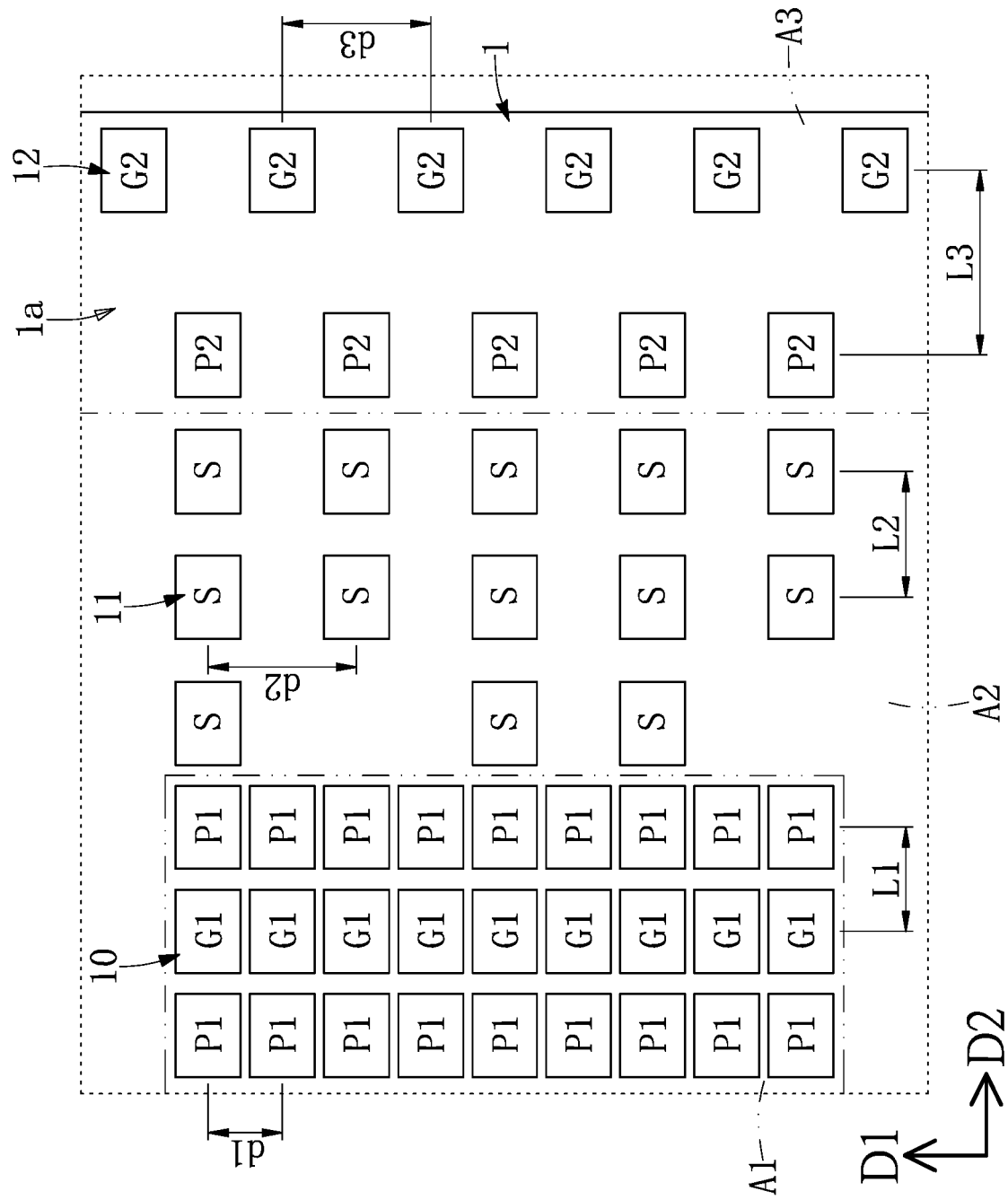
FIG. 2 shows an enlarged view of section II of FIG. 1 according to the embodiment of the present disclosure.
Figure 3:
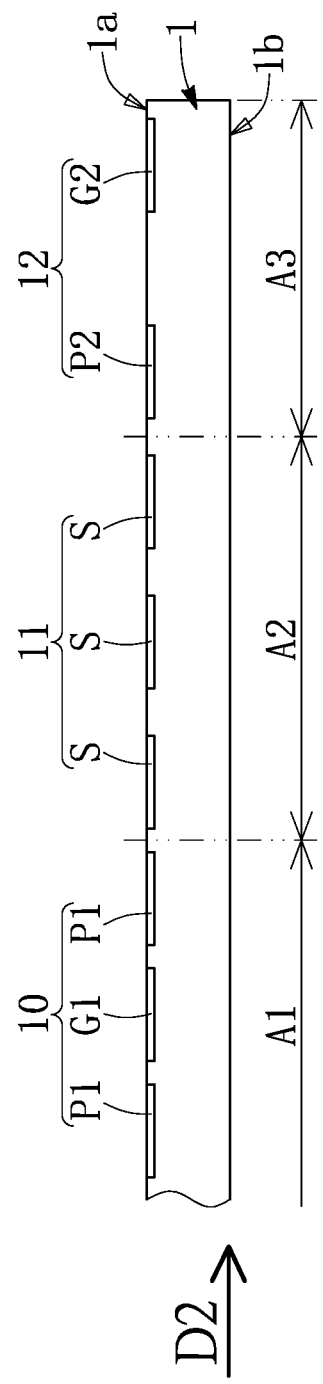
FIG. 3 is a partial schematic side view of the chip shown in FIG. 1.

Reference is made to FIG. 1 to FIG. 3. FIG. 1 is a schematic top view of a chip according to an embodiment of the present disclosure. FIG. 2 shows an enlarged view of the chip taken on part II of FIG. 1. FIG. 3 is a partial schematic side view of the chip shown in FIG. 1.

As shown in FIG. 1 and FIG. 3, a chip 1 of the embodiment of the present disclosure has a first surface 1a and a second surface 1b opposite to the first surface 1a. Furthermore, as shown in FIG. 1, the first surface 1a of the chip 1 can be divided into a first region A1, a second region A2 and a third region A3 from a center to an edge of the chip 1 along a radial direction.

As shown in FIG. 1, the first region A1 is a central region of the first surface 1a, the second region A2 surrounds the first region A1, and the third region A3 surrounds the second region A2 (and the first region A1). That is to say, the second region A2 is located between the first region A1 and the third region A3.

Reference is made to FIG. 2. The chip 1 includes a flip-chip pad group 10, a signal pad group 11, and a wire-bonding pad group 12. The flip-chip pad group 10 is disposed in the first region A1 and includes a plurality of pads. To be more specific, the flip-chip pad group includes a plurality of flip-chip power pads P1 and a plurality of flip-chip ground pads G1, which are jointly arranged in an array.

Specifically, the flip-chip power pads P1 are arranged in at least one column (two columns are shown in FIG. 2) in a first direction D1, and the flip-chip ground pads G1 are arranged in another column in the first direction D1. In one embodiment, a plurality of columns of the flip-chip power pads P1 and a plurality of columns of the flip-chip ground pads G1 are alternately arranged in the first region A1.

In the instant embodiment, each of the columns of the flip-chip ground pads G1 is interposed between two adjacent columns of the flip-chip power pads P1. That is to say, in a second direction D2, one of the flip-chip ground pads G1 is disposed between two adjacent ones of the flip-chip power pads P1. It should be noted that the flip-chip pad group 10 illustrated in FIG. 2 is only exemplified for description, but not intended to limit the scope of the present disclosure. The numbers and arrangements of the flip-chip power pads P1 and the flip-chip ground pads G1 can be adjusted according to actual implementations.

Figure 4:
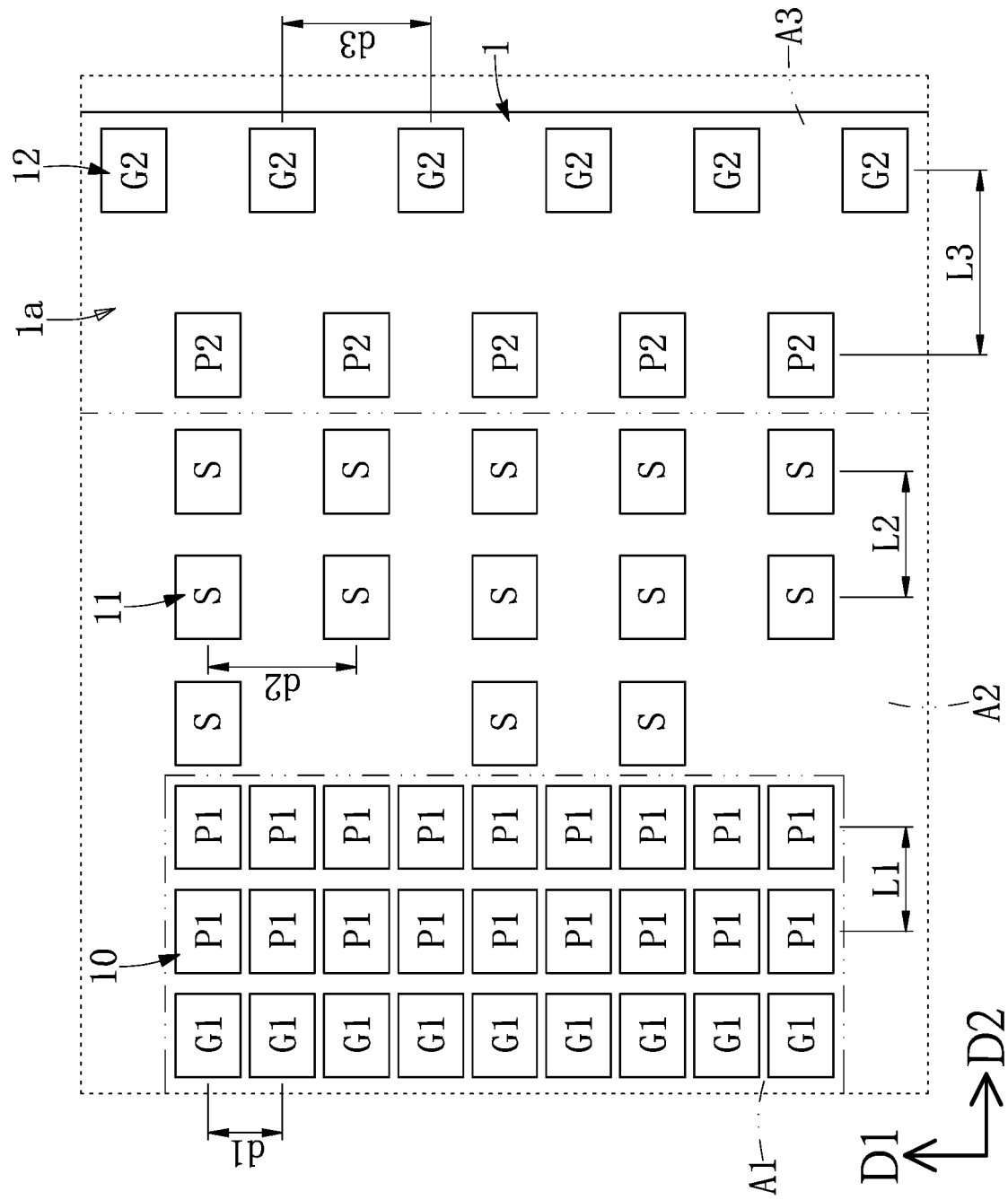
FIG. 4 shows an enlarged view of a chip according to another embodiment of the present disclosure.

Reference is made to FIG. 4, which shows an enlarged view of a chip according to another embodiment of the present disclosure. In the flip-chip pad group 10 of the instant embodiment, the arrangements of the flip-chip power pads P1 and the flip-chip ground pads G1 are different from those shown in FIG. 2. Specifically, as shown in FIG. 4, in the flip-chip pad group 10, at least two columns of the flip-chip power pads P1 are adjacent to each other. In another embodiment, in the flip-chip pad group 10, at least two columns of the flip-chip ground pads G1 can be adjacent to each other.

Accordingly, as long as the flip-chip power pads P1 and the flip-chip ground pads G1 can be arranged to comply with the flip-chip packaging technology, the arrangements of the flip-chip power pads P1 and the flip-chip ground pads G1 are not limited to the examples provided herein.

Reference is made to FIG. 2. The signal pad group 11 is disposed in the second region A2 and includes a plurality of signal pads S. The signal pads S are arranged to surround the first region A1. In the embodiment shown in FIG. 2, the signal pads S are arranged in three columns (or three rows) near to one side of the first region A1, but the present disclosure is not limited thereto. In another embodiment, the number and arrangement of the signal pads S can be adjusted based on the functions and size of the chip 1.

For example, the signal pads S can be respectively defined as different signal terminals, such as a VCC pad, a VDD pad, a VSS pad, a power supply pad, a clock-signal pad, an address signal pad, and so on.

It should be noted that the signal pads S of the signal pad group 11 can be arranged to comply with both of the flip-chip and wire-bonding packaging technologies. Generally, a pitch between any two adjacent pads required in the wire-bonding packaging technology would be larger than that required in the flip-chip packaging technology. Accordingly, in order to comply with both of the requirements of the wire-bonding and flip-chip packaging technologies, a pitch d2 between two adjacent ones of the signal pads S in the same column would primarily meet the requirements of the wire-bonding packaging technology.

Therefore, the pitch d2 between any two adjacent ones of the signal pads S in the same column is larger than a pitch d1 between any two adjacent ones of the flip-chip ground pads G1 (or the flip-chip power pads P1) in the same column. The aforementioned pitch can be defined as the shortest distance between two geometric centers of two adjacent pads at the same column, such as two adjacent signal pads S. Furthermore, a column pitch L2 between two adjacent columns of the signal pads S in the second region A2 is larger than a column pitch L1 between two adjacent columns of the flip-chip power pads P1 (or the flip-chip ground pads G1) in the first region A1.

Reference is made to FIG. 2. The wire-bonding pad group 12 includes a plurality of wire-bonding power pads P2 and a plurality of wire-bonding ground pads G2. The wire-bonding ground pads G2 are arranged in a first column along an edge of the chip 1. Furthermore, the wire-bonding power pads P2 are arranged in a second column along the edge of the chip 1, and the second column is located at the inner side of the first column. That is, the second column is farther away from the edge of the chip 1 than the first column.

In another embodiment, the two positions of the first and second columns can be switched with each other. In other words, the wire-bonding ground pads G2 are farther away from the edge of the chip 1, and the wire-bonding power pads P2 are closer to the edge of the chip 1.

It should be noted that, only a part of the chip 1 is illustrated to elaborate the present disclosure. In practice, the wire-bonding ground pads G2 and the wire-bonding power pads P2 are arranged along the entire edge of the chip 1 and surround the second region A2.

In the instant embodiment, any two adjacent wire-bonding power pad P2 and wire-bonding ground pad G2 are offset from each other in the second direction D2. As shown in FIG. 2, an imaginary connecting line between two geometric centers of two adjacent wire-bonding power pad P2 and wire-bonding ground pad G2 is not parallel to the second direction D2.

A pitch d3 between two adjacent ones of the wire-bonding ground pads G2 in the first column is substantially the same as a pitch between two adjacent ones of the wire-bonding power pads P2 in the second column. It should be noted that since the wire-bonding pad group 12 is arranged to comply with the requirements of the wire-bonding packaging technology, the pitch d3 between two adjacent ones of the wire-bonding ground pads G2 is greater that the pitch d1 between two adjacent ones of the flip-chip ground pads G1 in the same column.

In addition, a column pitch L3 between two adjacent columns (the first and second columns) in the third region A3 is greater than the column pitch L1 between two adjacent columns in the first region A1.

Figure 5:
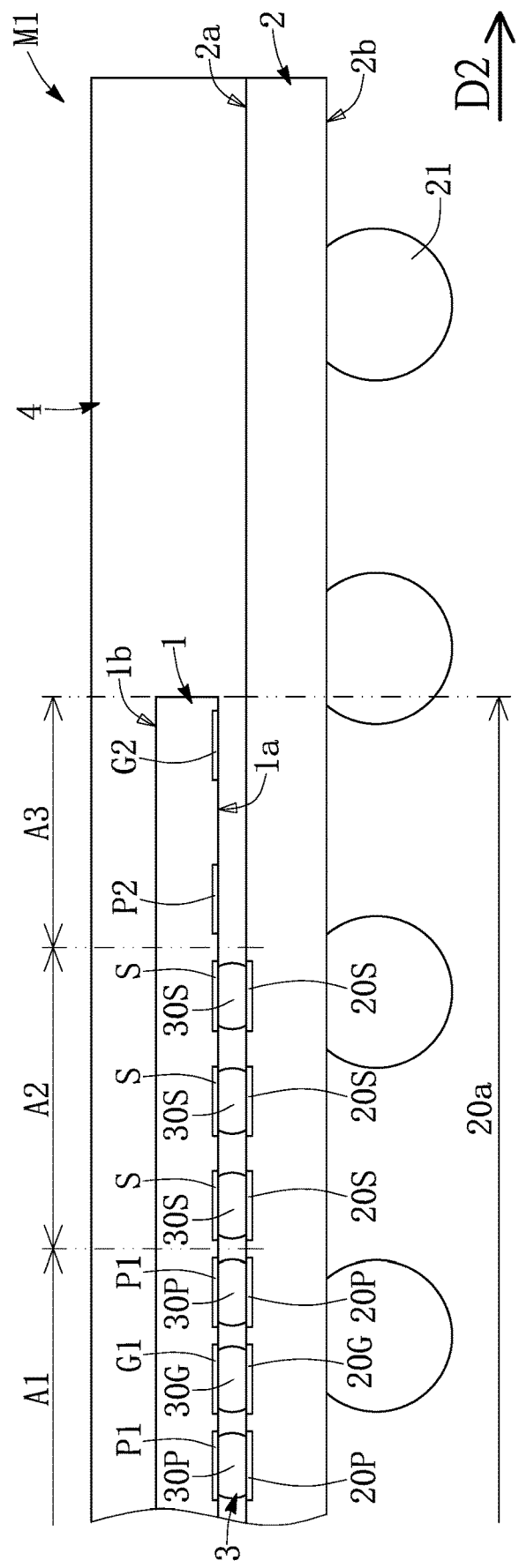
FIG. 5 is a partial schematic side view of a chip package module according to a first embodiment of the present disclosure.

Accordingly, the chip 1 provided in the embodiments of the present disclosure can be packaged by any one of the flip-chip or wire-bonding packaging technologies. Reference is made to FIG. 5, which is a partial schematic side view of a chip package module M1 that is fabricated by packaging the chip 1 with the flip-chip packaging technology. The chip package module M1 includes a chip 1, a package substrate 2, a conductive connector assembly 3 and a molding layer 4. The package substrate 2 has a supporting surface 2a and a bottom surface 2b opposite to the supporting surface 2a.

The package substrate 2 can be a circuit board, a ceramic board, a metal board, or a board made of composite material. In the instant embodiment, the package substrate 2 is a circuit board and includes a plurality of interconnecting wires (not shown) configured therein, a plurality of solder pads 20G, 20P, 20S disposed on the supporting surface 2a, and a plurality of solder balls 21 disposed on the bottom surface 2b. Specifically, the solder pads 20G, 20P, 20S and the solder balls 21 can be electrically connected one another through the interconnecting wires configured in the package substrate 2.

The solder pads 20G, 20P, 20S can include a plurality of power solder pads 20P, a plurality of ground solder pads 20G, and a plurality of signal pads 20S. In the instant embodiment, the interconnecting wires, the solder pads 20G, 20P, 20S, and the solder balls 21 of the package substrate 2 are arranged to comply with the requirements of the flip-chip packaging technology.

To be more specific, as shown in FIG. 5, the supporting surface 2a of the package substrate 2 is defined with a predetermined chip mounting area 20a, and the solder pads 20G, 20P, 20S are arranged in the predetermined chip mounting area 20a. When the chip 1 is disposed on the package substrate 2, the first surface 1a of the chip 1 faces toward the package substrate 2, i.e., the chip 1 is disposed on the package substrate 2 in a flip chip manner. The power solder pads 20P, the ground solder pads 20G, and the signal solder pads 20S are disposed under the chip 1.

Furthermore, in the instant embodiment, the power solder pads 20P and the ground solder pads 20G are arranged in an array. To be more specific, the power solder pads 20P are arranged to respectively correspond to the flip-chip power pads P1, and the ground solder pads 20G are arranged to respectively correspond to the flip-chip ground pads G1. Similarly, the signal solder pads 20S are arranged under the second region A2 and correspond to the signal pads S, respectively.

When the chip 1 is disposed on the package substrate 2, the chip 1 can be electrically connected to the package substrate 2 through the conductive connector assembly 3. In the instant embodiment, the electrical connector assembly 3 is electrically and physically connected to the flip-chip pad group 10, but is not physically connected to the wire-bonding pad group 12. That is to say, when the chip 1 is packaged by using the flip-chip packaging technology, all of the wire-bonding power pads P2 and the wire-bonding ground pads G2 of the chip 1 are dummy pads.

Furthermore, according to the packaging technology of the chip 1 is the flip-chip or wire-bonding packaging technology, the conductive connector assembly 3 of the instant embodiment can include either a plurality of (conductive) bumps or a plurality of bonding wires. In the embodiment shown in FIG. 5, the conductive connector assembly 3 includes a plurality of power bumps 30P, a plurality of ground bumps 30G, and a plurality of signal bumps 30S.

Each of the power bumps 30P is connected between the corresponding one of the power solder pads 20P and the corresponding one of the flip-chip power pads P1. Each of the ground bumps 30G is connected between the corresponding one of the ground solder pads 20G and the corresponding one of the flip-chip ground pads G1. Each of the signal bumps 30S is connected between the corresponding one of the signal pads 20S and the corresponding one of the signal pads S. As such, the chip 1 can be mounted on and electrically connected to the package substrate 2 through the conductive connector assembly 3. The molding layer 4 covers the chip 1 and the supporting surface 2a of the package substrate 2 so as to protect the chip 1.

Figure 6:
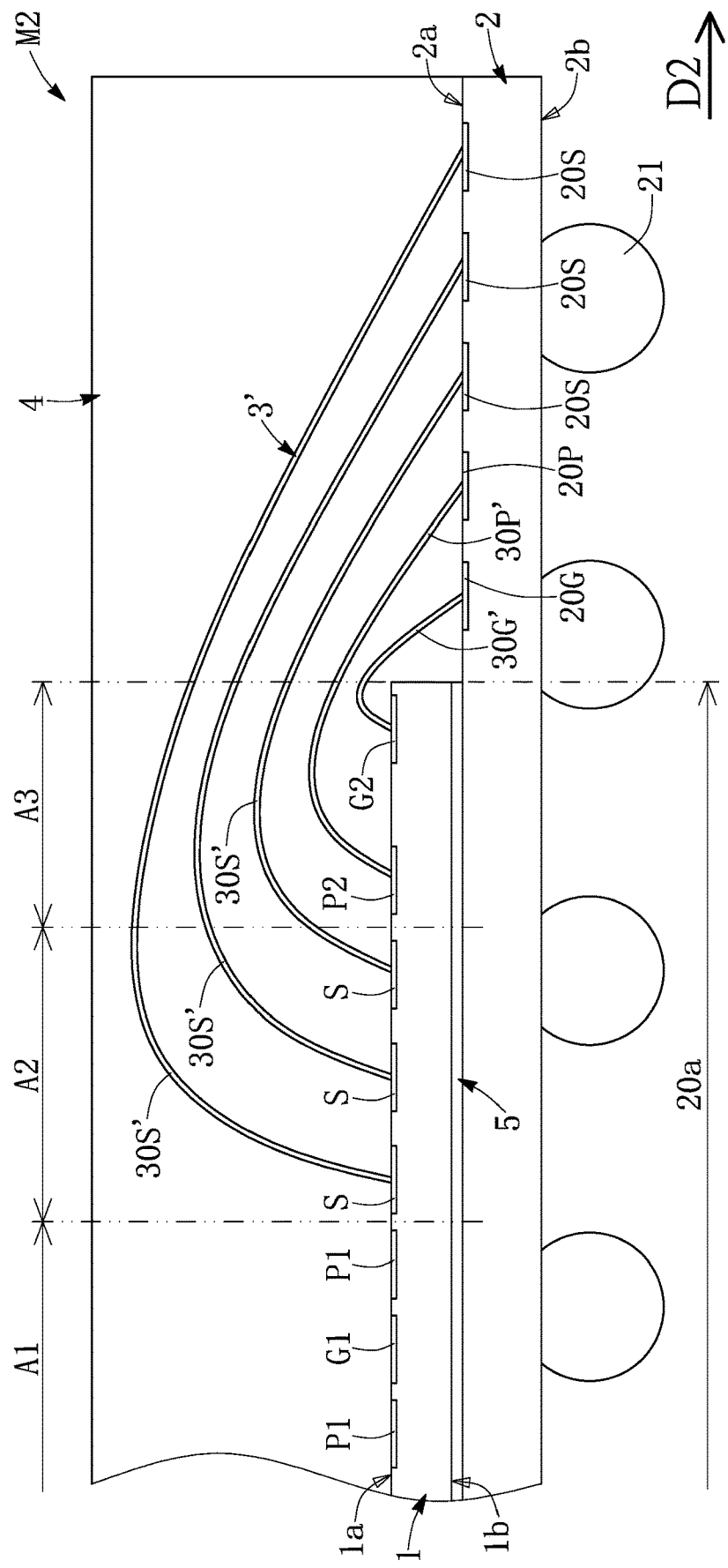
FIG. 6 is a partial schematic side view of a chip package module according to a second embodiment of the present disclosure.

Reference is made to FIG. 6, which is a partial schematic side view of a chip package module M2 that is fabricated by packaging the chip 1 with the wire-bonding packaging technology.

The chip package module M2 includes the chip 1, a package substrate 2, a conductive connector assembly 3', and a molding layer 4. In the instant embodiment, the solder pads 20G, 20P, 20S, the interconnecting wires, and the solder balls 21 are arranged to comply with the requirements of the wire-bonding packaging technology. Therefore, the solder pads (including the power solder pads 20P, the ground solder pads 20G, the signal solder pads 20S) are located at the outside of the predetermined chip mounting area 20*a*, and surround the predetermined chip mounting area 20*a*.

In one embodiment, in the solder balls 21 disposed on the bottom surface 2*b* of the package substrate 2, some of the solder balls 21 are electrically connected to the power solder pads 20P and the ground solder pads 20G, and are arranged in a region overlapping with the predetermined chip mounting area 20*a* in a thickness direction of the package substrate 2 (i.e., some of the solder balls 21 are arranged under the predetermined chip mounting area 20*a*). Accordingly, compared to the signal solder pads 20S, any one of the power solder pads 20P and the ground solder pads 20G is located at a position closer to the predetermined chip mounting area 20*a*.

The chip 1 is disposed on the package substrate 2 with the second surface 1*b* thereof facing toward the package substrate 2. That is to say, the arrangement direction of the chip 1 in the instant embodiment, in which the first surface 1*a* of the chip 1 faces upward, is opposite to that in the embodiment shown in FIG. 5. Furthermore, the chip package module M2 further includes an adhesive layer 5 interposed between the chip 1 and the package substrate 2, such that the chip 1 can be fixed on the package substrate 2.

Furthermore, as shown in FIG. 6, a shortest distance between any one of the signal solder pads 20S and the chip 1 is greater than that between any one of the power solder pads 20P and the chip 1. Additionally, the shortest distance between any one of the signal solder pads 20S and the chip 1 is greater than that between any one of the ground solder pads 20G and the chip 1. As long as the aforementioned conditions are satisfied, the positions of the plurality of the power solder pads 20P and the plurality of ground solder pads 20G can be switched with each other, and the present disclosure is not limited thereto.

When the chip 1 is disposed on the package substrate 2, the chip 1 can be electrically connected to the package substrate 2 through the conductive connector assembly 3'. One of the differences between the instant embodiment and the embodiment shown in FIG. 5 is that the conductive connector assembly 3' is electrically and physically connected to the wire-bonding pad group 12 in the instant embodiment, rather than the flip-chip pad group 10. That is to say, when the chip 1 is packaged by using the wire-bonding packaging technology, all of the flip-chip power pads P1 and the flip-chip ground pads G1 are dummy pads.

Furthermore, in the embodiment shown in FIG. 6, the conductive connector assembly 3' includes a plurality of power bonding wires 30P', a plurality of ground bonding wires 30G', and a plurality of signal bonding wires 30S'. Each of the power bonding wires 30P' is connected between the corresponding one of the power solder pads 20P and the corresponding one of the wire-bonding power pads P2, and each of the ground bonding wires 30G' is connected between the corresponding one of the ground solder pads 20G and the corresponding one of the wire-bonding ground pads G2. Each of the signal bonding wires 30S' is connected between the corresponding one of the signal solder pads 20S and the corresponding one of the signal pads S. Therefore, the chip 1 can be electrically connected to the package substrate 2 through the conductive connector assembly 3' and electrically connected to an external control circuit through the solder balls 21 of the package substrate 2.

It should be noted that whether the chip 1 is packaged by the flip-chip or wire-bonding packaging technology, the signal pad group 11 of the chip 1 are electrically connected to the conductive connector assembly 3 (3'). That is to say, when the chip 1 is mounted on the package substrate 2 in the flip-chip manner, the signal pads S are respectively connected to the signal bumps 30S so as to be electrically connected to the signal solder pads 20S, respectively. When the chip 1 is connected to the package substrate 2 in the wire-bonding manner, the signal pads S are respectively connected to the signal bonding wires 30S' so as to be electrically connected to the signal solder pads 20S, respectively.

In conclusion, one of the advantages of the present disclosure is that in the chip package module M1(M2) provided herein, by the technical features of "the chip 1 including the flip-chip pad group 10, the wire-bonding pad group 12, and the signal pad group 11" and "one of the flip-chip pad group 10 and the wire-bonding pad group 12 is electrically and physically connected to the conductive connector assembly 3(3'), and the other one is not physically connected to the conductive connector assembly 3(3')," the chip package module M1(M2) can be fabricated by packaging the chip 1 with the flip-chip or wire-bonding packaging technology, thereby improving application flexibility of the chip 1. That is to say, the chip 1, which includes the flip-chip pad group 10, the wire-bonding pad group 12, and the signal pad group 11 and is provided in the embodiments of the present disclosure, can be packaged by any one of the flip-chip and wire-bonding packaging technologies.

For example, according to particular implementations, the chip 1 can be packaged by the flip-chip packaging technology to fabricate the chip package module M1 that can be used in high-end electronic products. Furthermore, the chip 1 can also be packaged by the wire-bonding packaging technology to fabricate the chip package module M2 that can be used in middle-end or low-end electronic products.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip package module, comprising:
    a package substrate;
    a chip disposed on the package substrate, wherein the chip has a first surface and a second surface opposite to the first surface, the first surface is divided into a first region, a second region, and a third region, the second region is located between the first region and the third region, and the chip includes a flip-chip pad group disposed in the first region, a wire-bonding pad group disposed in the third region, and a signal pad group disposed in the second region; and
    a conductive connector assembly electrically connected between the chip and the package substrate, wherein one of the flip-chip pad group and the wire-bonding pad group is electrically and physically connected to the conductive connector assembly, and the other one of the flip-chip pad group and the wire-bonding pad group is not physically connected to the conductive connector assembly;
    wherein the flip-chip pad group includes a plurality of flip-chip power pads and a plurality of flip-chip ground pads, and the plurality of flip-chip power pads and the plurality of flip-chip ground pads are jointly arranged in an array; and
    wherein the wire-bonding pad group includes a plurality of wire-bonding power pads and a plurality of wire-bonding ground pads, the plurality of wire-bonding ground pads and the plurality of wire-bonding power pads are arranged in a first column and a second column along an edge of the chip, respectively, and any two adjacent ones of the wire-bonding power pad and wire-bonding ground pad are offset from each other.

2. The chip package module according to claim 1, wherein the first region is a central region of the first surface, the second region surrounds the first region, and the third region surrounds the second region.

3. The chip package module according to claim 1, wherein the chip is disposed on the package substrate with the first surface facing toward the package substrate, and the package substrate includes a plurality of power solder pads, a plurality of ground solder pads, and a plurality of signal solder pads, and the plurality of power solder pads, the plurality of ground solder pads, and the plurality of signal solder pads are disposed beneath the chip.

4. The chip package module according to claim 3, wherein the signal pad group includes a plurality of signal pads, the conductive connector assembly is electrically and physically connected to the flip-chip pad group, and the conductive connector assembly includes:
    a plurality of power bumps, wherein each of the plurality of power bumps is connected between a corresponding one of the plurality of power solder pads and a corresponding one of the plurality of flip-chip power pads;
    a plurality of ground bumps, wherein each of the plurality of ground bumps is connected between a corresponding one of the plurality of ground solder pads and a corresponding one of the plurality of flip-chip ground pads; and
    a plurality of signal bumps, wherein each of the plurality of signal bumps is connected between a corresponding one of the plurality of signal solder pads and a corresponding one of the plurality of signal pads.

5. The chip package module according to claim 1, wherein the signal pad group includes a plurality of signal pads, and the plurality of signal pads are arranged to surround the first region.

6. The chip package module according to claim 5, wherein the flip-chip pad group includes a plurality of flip-chip ground pads that are arranged in at least one column, and a pitch between any two adjacent ones of the plurality of signal pads is greater than a pitch between any two adjacent ones of the plurality of flip-chip ground pads.

7. The chip package module according to claim 1, wherein the chip is disposed on the package substrate with the second surface facing toward the package substrate, the package substrate includes a plurality of power solder pads, a plurality of ground solder pads, and a plurality of signal solder pads, and the plurality of power solder pads, the plurality of ground solder pads, and the plurality of signal solder pads are arranged in a region surrounding the chip;
    wherein a shortest distance between any one of the plurality of signal solder pads and the chip is greater than a shortest distance between any one of the plurality of power solder pads and the chip, and is greater than a shortest distance between any one of the plurality of ground solder pads and the chip.

8. The chip package module according to claim 7, wherein the signal pad group includes a plurality of signal pads, and the conductive connector assembly is electrically and physically connected to the wire-bonding pad group, and the conductive connector assembly includes:
    a plurality of power bonding wires, wherein each of the plurality of power bonding wires is connected between a corresponding one of the plurality of power solder pads and a corresponding one of the plurality of wire-bonding power pads;
    a plurality of ground bonding wires, wherein each of the plurality of ground bonding wires is connected between a corresponding one of the plurality of ground solder pads and a corresponding one of the plurality of wire-bonding ground pads; and
    a plurality of signal bonding wires, wherein each of the plurality of signal bonding wires is connected between a corresponding one of the plurality of signal solder pads and a corresponding one of the plurality of signal pads.

9. The chip package module according to claim 1, wherein the wire-bonding pad group includes a plurality of wire-bonding ground pads and a plurality of wire-bonding power pads, the flip-chip pad group includes a plurality of flip-chip ground pads and a plurality of flip-chip power pads, and a pitch between any two adjacent ones of the plurality of wire-bonding ground pads is greater than a pitch between any two adjacent ones of the plurality of flip-chip ground pads.

10. The chip package module according to claim 1, wherein the package substrate has a supporting surface and a bottom surface opposite to the supporting surface, the chip is disposed on the supporting surface, and the package substrate includes a plurality of solder balls disposed at the bottom surface.

11. The chip package module according to claim 1, wherein the conductive connector assembly is electrically and physically connected to the signal pad group.

* * * * *